United States Patent
Qiao et al.

(10) Patent No.: US 11,424,331 B1
(45) Date of Patent: Aug. 23, 2022

(54) POWER SEMICONDUCTOR DEVICE FOR IMPROVING HOT CARRIER INJECTION

(71) Applicant: University of Electronic Science and Technology of China, Chengdu (CN)

(72) Inventors: Ming Qiao, Chengdu (CN); Dingxiang Ma, Chengdu (CN); Zhengkang Wang, Chengdu (CN); Bo Zhang, Chengdu (CN)

(73) Assignee: UNIVERSITY OF ELECTRONIC SCIENCE AND TECHNOLOGY OF CHINA, Chengdu (CN)

(*) Notice: Subject to any disclaimer, the term of this patent is extended or adjusted under 35 U.S.C. 154(b) by 0 days.

(21) Appl. No.: 17/348,790

(22) Filed: Jun. 16, 2021

(30) Foreign Application Priority Data

Apr. 22, 2021 (CN) .......................... 202110436194.X (51) Int. Cl.
  *H01L 29/40* (2006.01)
  *H01L 29/78* (2006.01)
  *H01L 29/66* (2006.01)

(52) U.S. Cl.
  CPC .......... *H01L 29/404* (2013.01); *H01L 29/401* (2013.01); *H01L 29/407* (2013.01); *H01L 29/66681* (2013.01); *H01L 29/7816* (2013.01); *H01L 29/7825* (2013.01)

(58) Field of Classification Search
  CPC ... H01L 29/404; H01L 29/401; H01L 29/407; H01L 29/66681; H01L 29/7816; H01L 29/7825
  See application file for complete search history.

(56) References Cited

U.S. PATENT DOCUMENTS

| | | | |
|---|---|---|---|
| 2009/0140343 A1* | 6/2009 | Feilchenfeld | H01L 29/66689 257/E29.256 |
| 2017/0346477 A1* | 11/2017 | Xia | H01L 29/1095 |

* cited by examiner

*Primary Examiner* — Mohammed R Alam
(74) *Attorney, Agent, or Firm* — Bayramoglu Law Offices LLC (57) ABSTRACT

A power semiconductor device for improving a hot carrier injection is provided. A drain field plate is introduced at one side of a drain in a dielectric trench and connected to a drain electrode, having identical electric potential, thereby improving hole injection effects at a drain side of the dielectric trench. A shield gate field plate is introduced at one side of a source electrode in the dielectric trench and is connected to the source electrode or ground, thereby forming a shield gate. While decreasing gate drain parasitic capacitance $C_{gd}$, electron injection effects at a source electrode side of the dielectric trench are improved. With a trench etching method, the improvement of hot carrier injection can also be achieved by making carriers avoid a side wall of the dielectric trench on a path.

16 Claims, 7 Drawing Sheets

POWER SEMICONDUCTOR DEVICE FOR IMPROVING HOT CARRIER INJECTION

CROSS REFERENCE TO THE RELATED APPLICATIONS

This application is based upon and claims priority to Chinese Patent Application No. 202110436194.X filed on Apr. 22, 2021, the entire contents of which are incorporated herein by reference.

TECHNICAL FIELD

The present invention belongs to a power semiconductor device field and more particularly, relates to a power semiconductor device for improving hot carrier injection.

BACKGROUND

Power semiconductors are widely applied in power integrated circuits, especially DC-DC, AC-DC and other driving circuits, wherein a power LDMOS (Laterally-Diffused Metal-Oxide Semiconductor) attracts attention due to its feature of easy integration. In the developing process of the LDMOS, a plurality of innovative techniques aim to improve the LDMOS's figure of merit (FOM)=$BV^2/R_{on-sp}$ (FOM, Figure Of Merit). There is a plurality of measures to improve the trade-off between BV and $R_{on-sp}$: Super Junction (SJ), REduce SURface Field (RESURF), Local Oxidation of Silicon (LOCOS), Shallow Trench Isolation (STI) and Silicon On Insulator (SOI) etc. Structural types of the LDMOS have their respective features. The LDMOS using a dielectric trench is popular due to the features of folding a drift region, reducing a size of a cell and easy integration.

A hot carrier injection effect refers to energy obtained by carriers inside a device under high electric field, the carriers having an effective temperature higher than lattice temperature of carriers in balance. Changes occur to a motion track of these carriers and these carriers have probability to injected into dielectric along a direction perpendicular to surface of the dielectric (for example an oxide layer), such as being captured by a trapped charge in an oxidized layer. The captured charge exists in a dielectric layer and has an effect on motion of normal carriers in a semiconductor. Such effect is irreversible, causing problems like decreasing ON-resistance of the device, and shifting threshold voltage. Meanwhile, problems like causing current of a substrate and increasing current of a gate are likely caused, thus affecting normal work of a circuit.

With the progress of technology, sizes becoming smaller and smaller, and decreases of the device channel length, the drift region length and a gate dielectric thickness enable increase of transverse electric field and longitudinal electric field inside the device at a certain rate. Under long-term operations of the device, when the differential of voltage applied to source-drain of a power LDMOS increases, the integral of the impact ionization coefficient at a depletion region will reach 1 and the avalanche breakdown occurs in the device, in which case numerous hot carriers appear, resulting in hot carrier injection effect. Due to presence of the dielectric trench at the drift region, electric field concentrates at a corner, such that hot carriers are more likely to be generated here. The harm caused by injection of hot carriers will affect long-term reliability of the device, further worsening properties of the device. What's more, when the device is applied to an environment with high-speed switch, high electric field and high magnetic field, the hot carrier injection effect will become more prominent.

Nowadays, the LDMOS device is developed with features of low ON-resistance, high blocking voltage and low gate-drain capacitance $C_{gd}$. In order to obtain low gate-drain capacitance $C_{gd}$, the common method of the power MOS mainly includes decreasing an overlapping area of a gate-drain region. According to the capacitance formula $C=\varepsilon *S/d$, it can be known that the gate-drain capacitance will decrease if the overlapping area S decreases. Another common method involves introducing a shield gate. The electric potential of the shield gate is connected to the ground, such that the shield gate performs the function of a Faraday cage, thereby shielding connection of electric potential between gate and drain and also improving the gate-drain capacitance $C_{gd}$ to a certain extent. Some conventional LDMOS's structural defects having the dielectric trench are described below.

Figure 1:
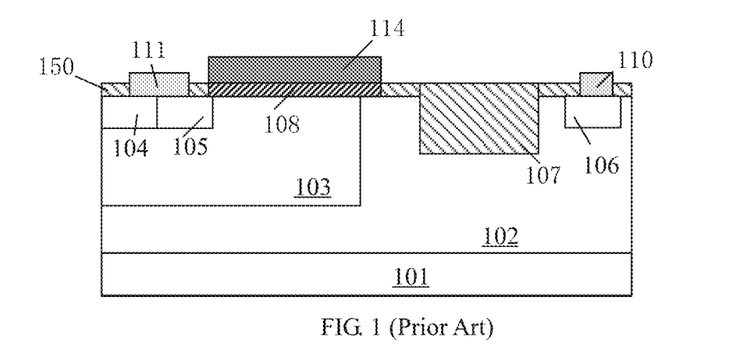
FIG. 1 is an LDMOS conventional structure having a dielectric trench.

Some conventional LDMOS structures having dielectric trenches are shown in FIG. 1. A dielectric trench 107 exists in an LDMOS drift region 102 and paths of carriers between source and drain are folded. For LOCOS, the ON-resistance of a device of STI may be made smaller. However, it cannot be avoided that at the left and right sides of the dielectric trench 107, when the differential of voltage applied to source-drain ends, the strength of the electric field inside the device increases to a certain value. In particular, due to the electric field concentration effects at a corner of the dielectric trench 107, the value of the electric field is higher, thereby more easily to generate hot carriers. At the left side of the dielectric trench 107, there is injection of hot electrons. At the right side of the dielectric trench 107, there is injection of hot holes. Such hot carrier injection brings problems to long-term reliability of the device.

Figure 2:
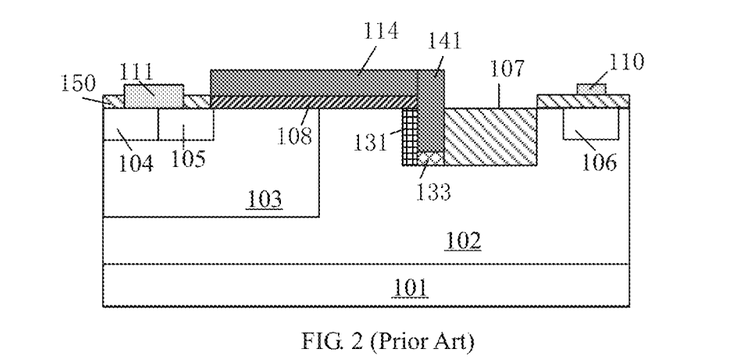
FIG. 2 is an LDMOS conventional structure having a dielectric trench.

Some conventional LDMOS structures having a dielectric trench are shown in FIG. 2. By extending a first gate electrode 114 above a part of the drift region 102, a second gate electrode 141 is embedded into the dielectric trench 107, performing the function of the field plate. Under an ON situation, an accumulation layer is formed at one side of the drift region 102 close to high electric potential gate electrode. The design of the structure decreases ON-resistance. However, it also improves the hot carrier injection effect at the source electrode side of the dielectric trench at the same time. On the other hand, the extending of the first gate electrode 114 enables increase of the overlapping area of the gate electrode and the drift region 102, resulting in increase of the gate-drain parasitic capacitance $C_{gd}$ of the LDMOS device. In this case, leading to a series of problems such as slower switching speed and higher switching power etc.

Figure 3:
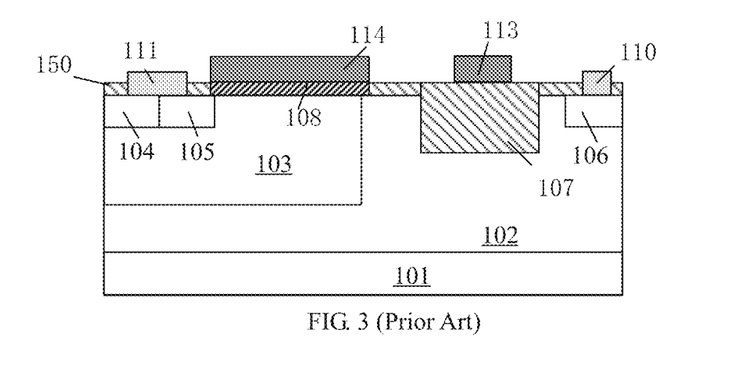
FIG. 3 is an LDMOS conventional structure having a dielectric trench.

Some conventional LDMOS structures having a dielectric trench are shown in FIG. 3. By introducing a Faraday cage 113 connected to a source end on the dielectric trench 107, the function of the Faraday cage is performed, blocking connection of electric potential between gate and drain and decreasing gate-drain parasitic capacitance $C_{gd}$ of the LDMOS device. However, the defect concerns that only decrease of switching loss is considered for such a design, without relieving the long-term reliability problem caused by injection of hot carriers into the dielectric trench.

Therefore, for the above problem, it is necessary to improve hot carrier injection caused by the dielectric trench in the LDMOS device and to simultaneously optimize switching loss caused by gate-drain parasitic capacitance $C_{gd}$ to a certain extent. Specific embodiments of the present invention appear under such background.

SUMMARY

This invention provides a novel power LDMOS device having a dielectric trench. The device can be used to improve long-term reliability of the device caused by injection of hot carriers into the dielectric trench. In the dielectric trench of a LDMOS drift region, with introduction of high electric potential by inserting a drain electrode field plate, electric field force pointing to an outer side of the dielectric trench is applied to a hole, to thus impact motion track of a hole carrier. Meanwhile, the shield gate is placed inside the trench to not only provide the Faraday cage to lower gate-drain capacitance $C_{gd}$, but also introduce low electric potential region. Electric field force pointing to an outer side of the dielectric trench is applied to electrons, to thus impact motion track of an electron carrier. On the other hand, when the device is at an OFF state, the shield gate has the function to assist in depletion of drift region. Introduction of the drain field plate and the shield gate electrode is able to improve injection of holes and electrons at two sides of the dielectric trench to a certain extent especially at the corner. Meanwhile, in order to improve injection of hot carriers to the dielectric trench, collision of carriers against side walls of the dielectric trench can also be avoided by introducing deep electrodes to change motion track of carriers. On the basis of improving hot carrier injection, the present invention makes some improvements to parasitic effect. For example, embedding of the dielectric trench introduces JFET resistance locally. By increasing the doping concentration of this region, JFET effect will be improved and meanwhile ON-resistance on the current path will decrease.

In order to realize the above objectives of the present invention, the technical solution of the present invention is provided as follows:

The present invention provides a power semiconductor device for improving hot carrier injection, comprising a second doping type substrate 101, a first doping type drift region 102 provided on the substrate 101 and a dielectric trench 107 on a surface of the drift region 102;

wherein the dielectric trench 107 comprises a drain field plate 115 positioned at one side of the dielectric trench 107 close to a drain, and a shield gate electrode 120 entirely positioned between gate and drain and positioned at one side of the dielectric trench 107 close to a source electrode, a first oxide layer 131 is provided at one side of the shield gate electrode 120 close to the source electrode, a third oxide layer 133 is provided at the bottom of the shield gate electrode 120, and a second oxide layer 132 is provided at one side of the drain field plate 115 close to the drain; the drain field plate 115 in the dielectric trench is connected to a drain electrode 110, having a same electric potential; and the shield gate electrode 120 in the dielectric trench 107 is connected to a source electrode 111, having a same low electric potential or ground connection;

the power semiconductor device comprises a first body region 103 of a second doping type on a surface of the drift region 102, a drain region 106 of a first doping type, a second body region 104 of the second doping type and a source region 105 of the first doping type, the second body region 104 and the source region 105 being provided inside the first body region 103; the gate dielectric 108 covers an upper surface of the first body region 103 and covers a part of upper surfaces the source region 105 and the drift region 102, a first gate electrode 114 is provided on an upper surface of the gate dielectric 108, the drain electrode 110 is provided on an upper surface of the drain region 106, and the source electrode 111 is provided on upper surfaces of the second body region 104 and the source region 105;

The gate dielectric 108 of the power semiconductor device is a gate oxide layer, and the first oxide layer 131, the second oxide layer 132 and the third oxide layer 133 can be a gate oxide layer or a field oxide layer; and the material of the shield gate electrode 120, the first gate electrode 114 and the drain field plate 115 can be metal or polysilicon.

As a preferred solution, a JFET region 121 is provided between the dielectric trench 107 and the first body region 103, the JFET region is of a first doping type and a doping concentration of the JFET region 121 is higher than a doping concentration of the drift region 102.

For the JFET region 121 provided between the dielectric trench 107 and the first body region 103, the present invention further provides a preparation method, comprising the following steps of:

1) using a manner of ion implanting to form a drift region and a first body region successively;
2) using a first photomask to etch on a surface of the drift region to form a dielectric trench;
3) filling dielectric into the dielectric trench;
4) using a second photomask to etch at the dielectric trench two needed empty trenches, the two empty trenches being located at positions corresponding to electrodes needing to be deposited;
5) using a manner of thermal oxidation to generate, on a silicon surface, an oxide layer, comprising an additional oxide layer, a gate oxide layer, a first oxide layer, a second oxide layer and a third oxide layer;
6) using a depositing technique to form a shield gate electrode 120, a drain field plate 115 and a first gate electrode 114 at positions of the two empty trenches' region and a position corresponding to a gate electrode;
7) using an ion implanting technique to respectively form a drain region 106, a JFET region 121, a source region 105 and a second body region 104;
8) etching through holes and depositing electrodes above the drain region 106, the source region 105 and the second body region 104 to form a drain electrode 110 and a source electrode 111.

As a preferred solution, a second gate electrode 141 is provided under the shield gate electrode 120; and one side of the first body region 103 close to the drain extends to the first oxide layer 131. Channel length modulation effects are improved by introducing a vertical channel.

The present invention further provides a second type power semiconductor device for improving hot carrier injection, comprising a first doping type substrate 101, a first doping type drift region 102 provided on the substrate 101, and a dielectric trench 107 on a surface of the drift region 102;

wherein the dielectric trench 107 comprises a drain field plate 115 positioned at one side of the dielectric trench 107 close to a drain and a second gate electrode 120 extending into the dielectric trench 107 and positioned at one side of the dielectric trench 107 close to a source electrode, a first oxide layer 131 is provided at one side of the second gate electrode 141 close to the source electrode, and a second oxide layer 132 is provided at one side of the drain field plate 115 close to the drain; the drain field plate 115 in the dielectric trench is connected to a drain electrode 110, having a same electric potential;

the power semiconductor device comprises a first body region 103) on a surface of the drift region 102 in which a second body region 104 and a source region 105 are provided, and a drain region 106; a gate dielectric 108 covers an upper surface of the first body region 103 and covers a part of upper surfaces of the source region 105 and the drift region 102, a first gate electrode 114 is provided on an upper surface of the gate dielectric 108, a drain electrode 110 is provided on an upper surface of the drain region 106, and a source electrode 111 is provided on upper surfaces of the second body region 104 and the source region 105;

the gate dielectric 108 of the power semiconductor device is a gate oxide layer, and the first oxide layer 131 and the second oxide layer 132 can be a gate oxide layer or a field oxide layer; and the material of the shield gate electrode 120, the first gate electrode 114, the drain field plate 115 and the second gate electrode 141 can be metal or polysilicon.

As a preferred manner, a third oxide layer 133 is provided at the bottom of the shield gate electrode 141. Thus ON-resistance of the device is lowered.

As a preferred manner, a shield gate electrode 120 is provided between the second gate electrode 141 and the third oxide layer 133, the shield gate electrode 120 in the dielectric trench 107 is connected to the source electrode 111, having a same low electric potential or ground connection. The third oxide layer 133 can be a gate oxide layer or a field oxide layer; and the material of the shield gate electrode 120 can be metal or polysilicon.

As a preferred manner, the dielectric trench 107 intersects the drain region 106 or a second drift region 140 is provided between the dielectric trench 107 and the drain region 106, wherein the second drift region 140 is of a first doping type.

The present invention further provides a third type power semiconductor device for improving hot carrier injection, comprising a first doping type substrate 101, a first doping type drift region 102 provided on the substrate 101, and a dielectric trench 107 on a surface of the drift region 102;

wherein the dielectric trench 107 comprises a shield gate electrode 120; the shield gate electrode 120 is positioned at one side of the dielectric trench 107 close to a source electrode, a first oxide layer 131 is provided at one side of the shield gate electrode 120 close to the source electrode, and a third oxide layer 133 is provided at the bottom of the shield gate electrode 120;

the power semiconductor device comprises a first body region 103 on a surface of the drift region 102 in which a second body region 104 and a source region 105 are provided; a gate dielectric 108 covers an upper surface of the first body region 103 and covers a part of upper surfaces of the source region 105 and the drift region 102, a first gate electrode 114 is provided on an upper surface of the gate dielectric 108, a drain electrode 110 is provided on an upper surface of the drain region 106, and a source electrode 111 is provided on upper surfaces of the second body region 104 and the source region 105;

a drain of the device comprises a deeply-embedded drain electrode 129 and a deep drain region 130 under the deeply-embedded drain electrode 129, the deep drain region 130 contacting a position of the dielectric trench 107 close to a corner of the drain;

the gate dielectric 108 of the power semiconductor device is a gate oxide layer, and the first oxide layer 131 and the second oxide layer 132 can be a gate oxide layer or a field oxide layer; and the material of the shield gate electrode 120 and the first gate electrode 114 can be metal or polysilicon.

As a preferred manner, the material of the dielectric trench 107 and the gate dielectric 108 is silicon oxide or high dielectric constant material.

As a preferred manner, the first doping type is N-type doping and the second doping type is P-type doping; or the first doping type is P-type doping and the second doping type is N-type doping.

The present invention has the advantageous effects of: with introduction of the shield gate and the drain field plate, making electric potential existing inside the dielectric trench and introduced from the outside when the device is in a breakdown state so as to improve injections of hot electrons and hot holes into the dielectric trench in different directions, thus achieving long-term reliability of the device. The introduction of the shield gate can also lower the gate-drain parasitic capacitance $C_{gd}$ and switching loss of the device. Meanwhile, a deeply-embedded drain electrode can also be used to perform the function of the drain field plate.

Among them, 101 is a substrate, 102 a drift region, 103 a first body region, 104 a second body region, 105 a source region, 106 a drain region, 107 a dielectric trench, 108 a gate dielectric, 110 a drain electrode, 111 a source electrode, 113 a Faraday cage, 114 a first gate electrode, 115 a drain field plate, 120 a shield gate electrode, 121 a JFET region, 129 a deeply-embedded drain electrode, 130 a deep drain electrode region, 131 a first oxide layer, 132 a second oxide layer, 133 a third oxide layer, 140 a second drift region, 141 a second gate electrode, 150 an additional oxide layer, 161 a shield gate empty trench and 162 a drain field plate empty trench.

DETAILED DESCRIPTION OF THE EMBODIMENTS

In order to make the problem solved in the present invention, the solution and the technical effect clearer, accompanying drawings will be incorporated below to further describe the present invention.

The following relates to structures in specific embodiments, especially a method for integrating a shield gate electrode into a dielectric trench and adding a drain field plate to the dielectric trench, thus improving hot carrier injection, which are applicable to not only LDMOS devices, but also LIGBT devices or power semiconductor devices with adopting of super junction techniques and REFURF techniques.

In the following embodiments, the material of the dielectric trench 107 and the gate dielectric 108 is silicon oxide or high dielectric constant material.

The material of the first gate electrode 114 is metal or polysilicon.

The material of the drain field plate 115 is metal or polysilicon.

The material of the shield gate electrode 120 is metal or polysilicon.

The material of the second gate electrode 141 is metal or polysilicon.

The gate dielectric 108 is a gate oxide layer.

The first oxide layer 131 is a gate oxide layer or a field oxide layer.

The second oxide layer 132 is a gate oxide layer or a field oxide layer.

The third oxide layer 133 is a gate oxide layer or a field oxide layer.

The first doping type is N-type doping and the second doping type is P-type doping; or the first doping type is P-type doping and the second doping type is N-type doping. The following embodiments are described with the first doping type being N-type doping and the second doping type being P-type doping.

Embodiment 1

Figure 4:
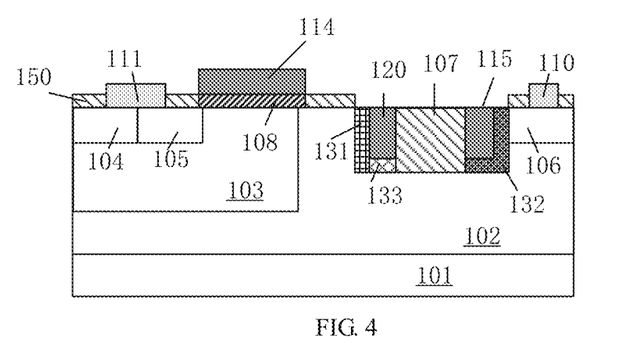
FIG. 4 is an LDMOS structure of improving hot carrier injection provided according to embodiment 1 of the present invention.

As shown in FIG. 4, a power LDMOS device having a dielectric trench, comprises a second doping type substrate 101, a first doping type drift region 102 provided on the substrate 101, and a dielectric trench 107 on a surface of the drift region 102;

wherein the dielectric trench 107 comprises a drain field plate 115 positioned at one side of the dielectric trench 107 close to a drain, and a shield gate electrode 120 entirely positioned between gate and drain and positioned at one side of the dielectric trench 107 close to a source electrode, a first oxide layer 131 is provided at one side of the shield gate electrode 120 close to the source electrode, a third oxide layer 133 is provided at the bottom of the shield gate electrode 120, and a second oxide layer 132 is provided at one side of the drain field plate 115 close to the drain; the drain field plate 115 in the dielectric trench is connected to a drain electrode 110, having a same electric potential; and the shield gate electrode 120 in the dielectric trench 107 is connected to a source electrode 111, having a same low electric potential or ground connection.

The power semiconductor device comprises a first body region 103 of a second doping type on a surface of the drift region 102, a drain region 106 of a first type doping, a second body region 104 of the second doping type and a source region 105 of the first doping type, the second body region 104 and the source region 105 being provided inside the first body region 103; the gate dielectric 108 covers an upper surface of the first body region 103 and covers a part of upper surfaces of the source region 105 and the drift region 102, a first gate electrode 114 is provided on an upper surface of the gate dielectric 108, the drain electrode 110 is provided on an upper surface of the drain region 106, and the source electrode 111 is provided on upper surfaces of the second body region 104 and the source region 105.

For this structure, when the first gate electrode 114 is connected to high electric potential, holes on the surface of the first body region are depleted, an inverse electron channel is generated and the device is in ON state, in which case the source electrode 111 is connected to low electric potential or ground, and the drain electrode 110 is connected to high electric potential. In order to obtain a smaller gate-drain capacitance $C_{gd}$, the first gate electrode 114 has a smaller overlapping portion with the drift region 102, i.e. the first gate electrode 114 only covers a very small portion of the drift region 102. Therefore, the first gate electrode 114 hardly performs the function of a field plate on an accumulation layer on one hand. On the other hand, the shield gate electrode 120 which not only blocks connection of electric potential between gate and drain to a certain extent, but also decreases gate-drain parasitic capacitance $C_{gd}$ is introduced into the dielectric trench. In addition, when the differential of voltage applied between the source and the drain is high enough, a hot electron-hole pair will be generated after the electric field inside the device goes beyond a critical breakdown electric field. Due to presence of the shield gate electrode 120, low electric potential is also introduced to the left side of the dielectric trench 107. The direction of electric field in the region points toward the outer side of the dielectric trench, which will improve collision of hot electrons against the dielectric trench at this location. Meanwhile, due to presence of the drain field plate 115, high electric potential is provided to thereby improve hot hole injection on the right side of the dielectric trench 107. When the device turns off, the first gate electrode 114 is connected to low electric potential, the channel does not start and the differential of voltage between the source and the drain is undertaken by a reverse PN junction consisting of the drift region 102 and the first body region 103. Meanwhile, the shield gate electrode 120 and the drain field plate 115 can also avoid hot carrier injection while being broken through.

Embodiment 2

Figure 5:
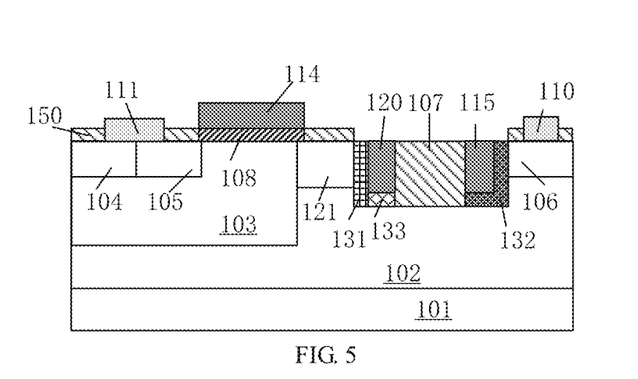
FIG. 5 is an LDMOS structure of improving hot carrier injection provided according to embodiment 2 of the present invention.

A power LDMOS device having a dielectric trench is shown in FIG. 5. In the embodiment, a JFET region 121 of a first doping type is introduced between the dielectric trench 107 and the first body region 103 on the basis of embodiment 1. A doping concentration of the JFET region 121 is higher than a doping concentration of the drift region 102.

For this structure, the substrate 101, the first body region 103 and the second body region 104 are of the second doping type, and the drain region 106, the source region 105, the drift region 102 and the JFET region 121 are of the first doping type. The drain electrode 110 is connected to high electric potential and the source electrode 111 is connected to low electric potential or ground. When the first gate electrode 114 is connected to high electric potential, a channel is formed on a surface of the first body region, the device is on, and the drain field plate 115 in the dielectric trench 107 is connected to the drain electrode 110, having a same electric potential. The shield gate electrode 120 in the dielectric trench 107 is connected to the source electrode 111, having a same electric potential. The PN junction consisting of the second body region 103 and the drift region 102 is reverse-biased. With increasing differential of electrical potential at two sides, the depletion region widens. In this case, a JFET resistance is introduced to the drift region 102 on the left side of the first oxide layer 131, and a region connected to the second body region 103. The widening of the depletion region impacts the ON-resistance value on a carrier path. Therefore, based on the specific embodiment 1, adding the JFET region 121 having a higher concentration can avoid the phenomenon, as doping of a higher concentration can improve spreading of the depletion region at this location, such that the electron ON-path is wider, thereby lowering the ON-resistance of the device. A doping concentration of the JFET region 121 is higher than a doping concentration of the drift region 102, which needs to be specifically decided according to the actual requirements. The design of the device still has the advantages of improving the hot carrier injection effect. When the electric field inside the device is high enough, a hot electron-hole pair is generated. In this case, the shield gate electrode 120 sets low electric potential on the left side of the dielectric trench 107 to improve hot electron injection, and the drain field plate 115 sets high electric potential on the right side of the dielectric trench 107 to improve hot hole injection.

Figure 12:
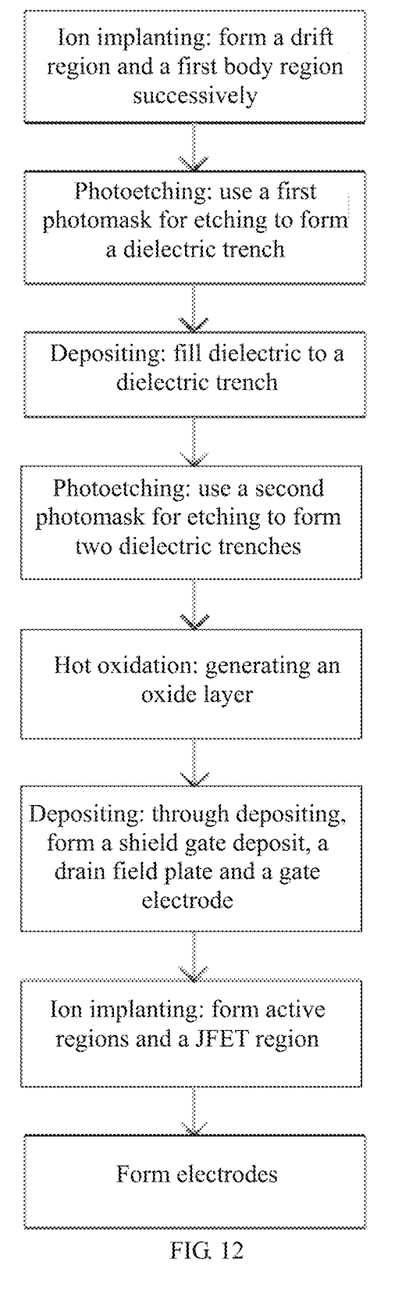
FIG. 12 is an LDMOS structure of improving hot carrier injection provided according to embodiment 2 of the present invention.

Here, a technical manufacturing process of the above specific embodiment 2 is further provided, as shown in FIG. 12.

For each step corresponding to FIG. 12, FIGS. 13A to 13H are corresponding technical steps in a power LDMOS structure according to embodiment 2. Detailed annotations of the drawing corresponding to the specific steps are described below.

Figure 13A:
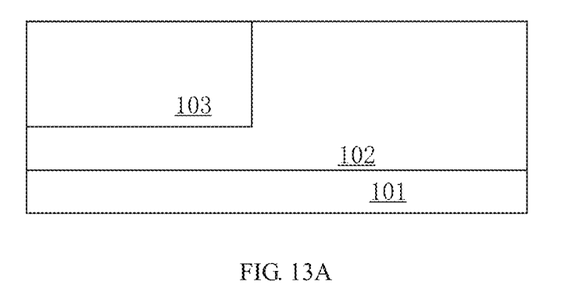
FIGS. 13A to 13H are corresponding process steps in a power LDMOS structure according to embodiment 2 of the present invention.
Figure 13B:
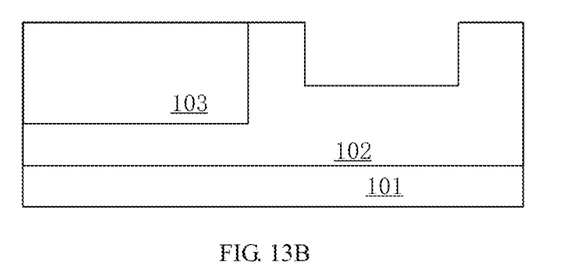
Figure 13C:
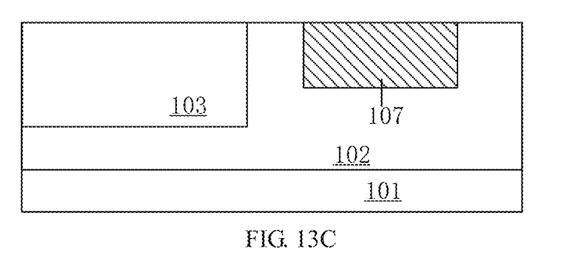
Figure 13D:
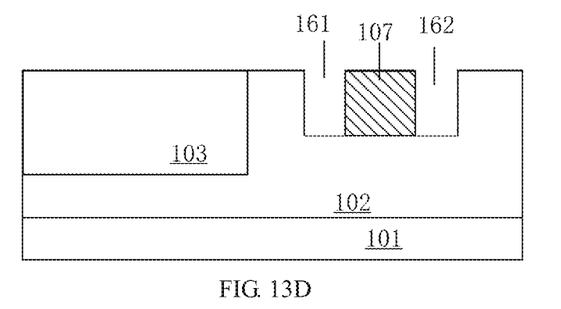
Figure 13E:
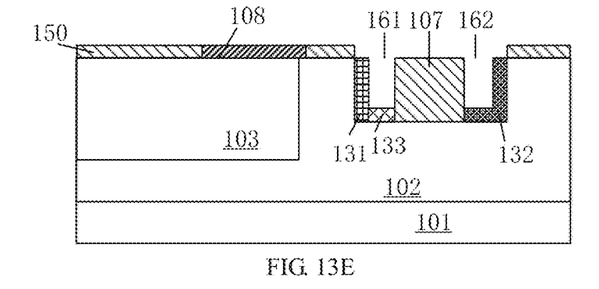

As shown in FIG. 13A, a first doping type drift region 102 and a first body region 103 of a second doping type are formed successively in a manner of ion implanting on a substrate 101;

As shown in FIG. 13B, a first photomask is used to etch on a surface of the drift region to form a dielectric trench;

As shown in FIG. 13C, dielectric is filled into the dielectric trench; As shown in FIG. 13D, a second photomask is used to etch at the dielectric trench 107 two needed positions for a shield gate empty trench 161 and a drain field plate empty trench 162;

As shown in FIG. 13E, oxide layers are formed through thermal oxidation, and comprise a gate dielectric 108, a first oxide layer 131, a second oxide layer 132, a third oxide layer 133 and an additional oxide layer 150, and the first oxide layer 131, the second oxide layer 132 and the third oxide layer 133 can be a gate oxide layer or a field oxide layer, which can be formed simultaneously or formed step by step. The additional oxide layer 150 may be formed simultaneously with the first oxide layer 131, the second oxide layer 132 and the third oxide layer 133 or no forming is selected through different technical steps.

Figure 13F:
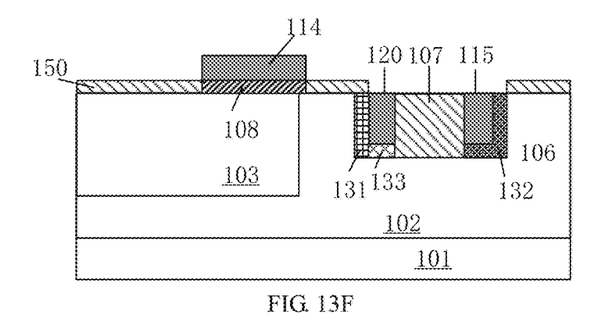

As shown in FIG. 13F, a depositing technique is used, at positions corresponding to the shield gate empty trench 161 and the drain field plate empty trench 162 and the position corresponding to the gate electrode, for depositing to form metal electrodes or for polysilicon depositing to form the first gate electrode 114, the shield gate electrode 120 and the drain field plate 115, which are not formed simultaneously.

Figure 13G:
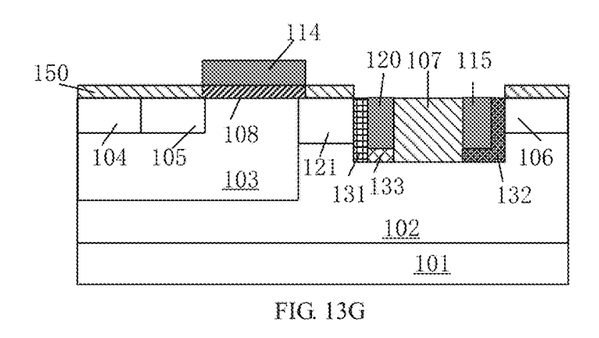

As shown in FIG. 13G an ion implanting technique is used to respectively form a drain region 106 of a first doping type, a JFET region 121, a source region 105 and a second body region 104 of a second doping type.

Figure 13H:
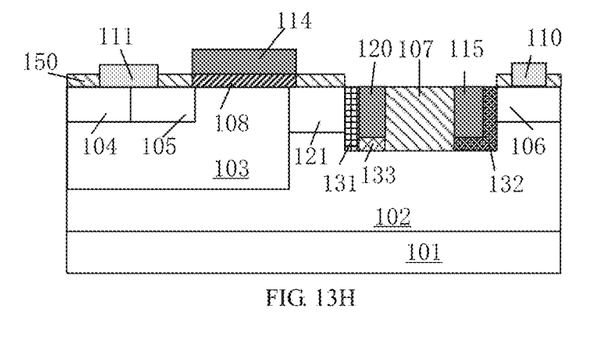

As shown in FIG. 13H, through holes are etched and electrodes are deposited above the drain region 106, the source region 105 and the second body region 104 to form a drain electrode 110 and a source electrode 111, which are used to provide electric potential for semiconductors of different regions.

Embodiment 3

Figure 6:
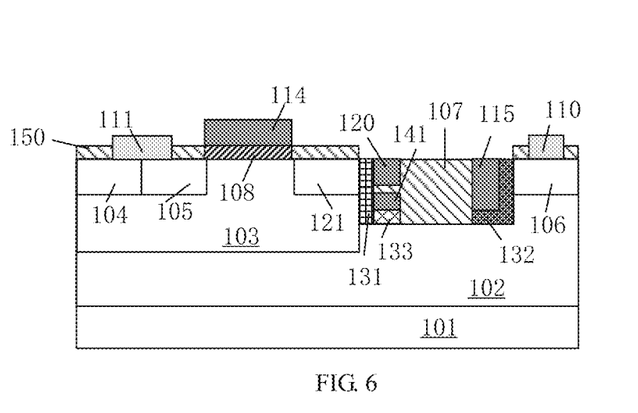
FIG. 6 is an LDMOS structure of improving hot carrier injection provided according to embodiment 3 of the present invention.

A power LDMOS device having a dielectric trench is shown in FIG. 6. On the basis of embodiment 1, a second gate electrode 141 is provided under the shield gate electrode 120; and one side of the first body region 103 close to the drain extends to the first oxide layer (131).

That is, compared with embodiment 1, the cross-section area of the first body region 103 is bigger. The length of the first gate electrode 114 in the embodiment is shorter than that of the gate electrode in the previous specific embodiments, as a part of channel length is transferred to the position corresponding to the left side of the second gate electrode 141 inside the dielectric trench 107.

For this structure, the substrate 101, the first body region 103 and the second body region 104 are of the second doping type, and the JFET region 121, the drain region 106, the source region 105, and the drift region 102 are of the first doping type. The drain field plate 115 in the dielectric trench 107 is connected to the drain electrode 110, having a same electric potential. The shield gate electrode 120 in the dielectric trench 107 is connected to the source electrode 111, having a same electric potential or ground connection. In order to avoid punch-through the channel in an ON situation, a part of the transverse channel is transferred into the longitudinal channel when the doping concentration of the drift region 102 does not change, the longitudinal channel corresponding to the left side of the second gate electrode 141 and a right-edge portion of the second body region 103. In this way, when the device deteriorates, punch-through firstly occurs to the corresponding longitudinal channel. As a result, punch-through will be avoided for the transverse channel. The specific embodiment improves channel length modulation effects in a small-sized LDMOS device. When the drain electrode 110 is connected to high electric potential, the source electrode 111 is connected to low electric potential and the first gate electrode 114 is connected to high electric potential, the second gate electrode 141 may be connected to the first gate electrode 114 or may be connected to an additional bias potential, but it is necessary to ensure opening of the channel. When drain-source voltage is high enough, breakdown occurs to the device. At a location where the value of electric field is high enough, hot carriers are generated and the shield gate electrode 120 connected to the source electrode 111 provides low electric potential on the left side of the dielectric trench 107, such that hot electron carriers are impacted by force away from the direction of the dielectric trench 107, thereby changing the current path and performing the function of improving hot electron injection. Similarly, the drain field plate 115 connected to the drain electrode 110 performs the function of improving hot hole injection on the right side of the dielectric trench 107. The presence of the shield gate electrode 120 also improves gate-drain parasitic capacitance $C_{gd}$ to a certain extent. In addition, a doping concentration of the JFET region 121 is a little higher than a doping concentration of the drift region 102 and the presence of the JFET region 121 makes the ON-resistance on the current path smaller to a certain extent, thereby lowering ON loss.

Embodiment 4

Figure 7:
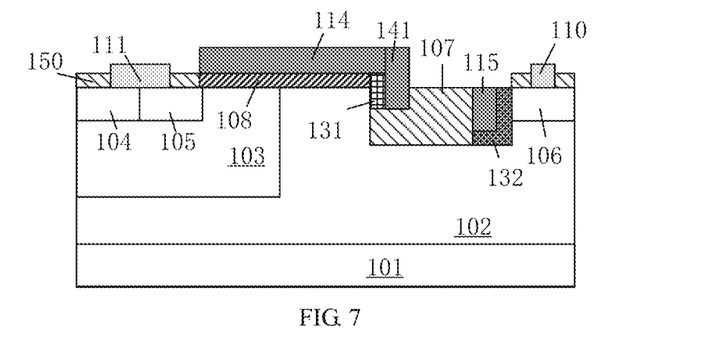
FIG. 7 is an LDMOS structure of improving hot carrier injection provided according to embodiment 4 of the present invention.

As shown in FIG. 7, a power LDMOS device having a dielectric trench, comprises a second doping type substrate 101, a first doping type drift region 102 provided on the substrate 101, and a dielectric trench 107 on a surface of the drift region 102;

wherein the dielectric trench 107 comprises a drain field plate 115 positioned at one side of the dielectric trench 107 close to a drain and a second gate electrode 141 extending into the dielectric trench 107 and positioned at one side of the dielectric trench 107 close to a source electrode, a first oxide layer 131 is provided at one side of the second gate electrode 141 close to the source electrode, and a second oxide layer 132 is provided at one side of the drain field plate 115 close to the drain; the drain field plate 115 in the dielectric trench is connected to a drain electrode 110, having a same electric potential;

the power semiconductor device comprises a first body region 103 on a surface of the drift region 102 in which a second body region 104 and a source region 105 are provided, and a drain region 106; a gate dielectric 108 covers an upper surface of the first body region 103 and covers a part of upper surfaces of the source region 105 and the drift region 102, a first gate electrode 114 is provided on an upper surface of the gate dielectric 108, a drain electrode 110 is provided on an upper surface of the drain region 106, and a source electrode 111 is provided on upper surfaces of the second body region 104 and the source region 105. The dielectric trench 107 intersects the drain region 106. The first body region 103 and the second body region 104 are of the second doping type, and the source region 105 and the drain region 106 are of the first doping type.

For this structure, when the first gate electrode 114 is connected to high electric potential, an inverse channel is formed on a surface of the first body region 103, the device starts, and the first gate electrode 114 also performs the function of the field plate. An accumulation layer of electrons is formed on a corresponding surface of the drift region 102, and the second gate electrode 141 and the first gate electrode 114 are connected to a same electric potential or an additional bias potential (when connected to an additional bias, the two electrodes cannot contact each other while being made), thereby forming an accumulation layer of a corresponding portion of the drift region 102. In order to reduce the overlapping area of the second gate electrode 141 and the drift region 102, the depth of the second gate electrode 141 embedded into the dielectric trench 107 will not impact carrier motion of the drift region 102 at the bottom, namely, the oxide layer at the bottom of the second gate electrode 141 is thick and the bottom thereof is a part of the dielectric trench 107. The short second gate electrode 141 improves the gate-drain parasitic capacitance $C_{gd}$, but it is not considered to add one electrode having low electric potential to design of the device. When breakdown occurs to the device, the problem of not improving hot electron injection exists on interfaces of the dielectric trench 107 and the drift region 107. However, in the specific embodiment, high electric potential is introduced at the dielectric trench 107 depending on the drain field plate 115, to improve hot hole injection on the right side of the dielectric trench 107 when hot carriers are generated at the breakdown of the device.

Embodiment 5

Figure 8:
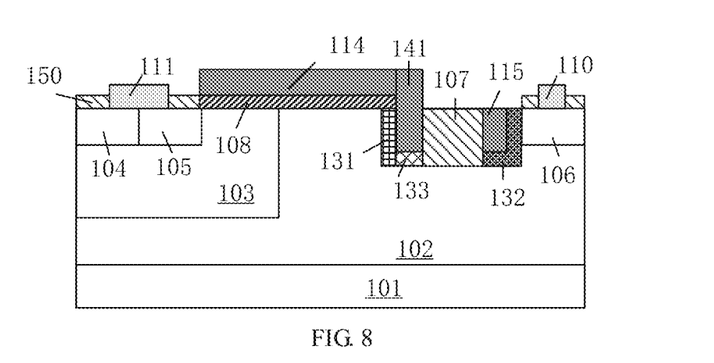
FIG. 8 is an LDMOS structure of improving hot carrier injection provided according to embodiment 5 of the present invention.

As shown in FIG. 8, a power LDMOS device having a dielectric trench comprises a LDMOS device. The embodiment differs from embodiment 4 in that a third oxide layer 133 is provided at the bottom of the second gate electrode 141. Thus ON-resistance of the device is lowered.

For this structure, the doping type is consistent with embodiment 4. On the basis of embodiment 4, the length of the second gate electrode 141 is longer, and seen above the surface of the dielectric trench 107, extends all the time to be embedded to the bottom of the dielectric trench 107. Moreover, a third oxide layer 133 is provided at the bottom of the second gate electrode 141. When the first gate electrode 114 is connected to high electric potential, an inverse channel is formed on a surface of the first body region 103 under the gate dielectric 108, and the device is in ON state. When the source electrode 111 is connected to low electric potential or ground and the drain electrode 110 is connected to high electric potential, the drain field plate 115 and the drain electrode 110 share the same electric potential, and the second gate electrode 141 and the first gate electrode 114 are connected to the same electric potential or other bias potential to thus ensure appearance of the accumulation layer, with voltage undertaken by a reverse PN junction between the drift region 102 and the first body region 103. Comparing this embodiment with embodiment 4, since the second gate electrode 141 is embedded to the dielectric trench 107 deeper, the accumulation layer is longer and the ON-resistance of the corresponding device is smaller. When the voltage differential sufficient to generate hot carriers is applied between the drain and the source, the device protects hot hole injection on the right side of the dielectric trench 107 through the drain field plate 115. However, as the shield gate electrode is not provided and the overlapping area between gate and drain increases, the gate-drain parasitic capacitance $C_{gd}$ increases, resulting in increasing switching loss. Moreover, the problem of this device is: at an ON state, the dielectric trench 107 is impacted by hot electrons on the left corner, resulting in injection of hot electrons in the dielectric trench and effects on reliability.

Embodiment 6

Figure 9:
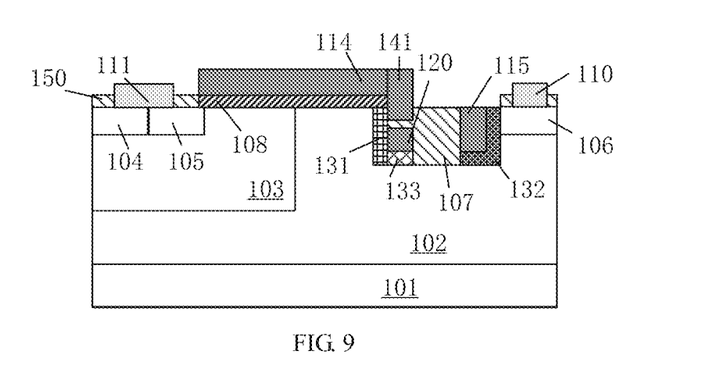
FIG. 9 is an LDMOS structure of improving hot carrier injection provided according to embodiment 6 of the present invention.

As shown in FIG. 9, a power LDMOS device having a dielectric trench, comprises: the embodiment differs from embodiment 5 in that: a shield gate electrode 120 is provided between the second gate electrode 141 and the third oxide layer 133, and the shield gate electrode 120 in the dielectric trench 107 is connected to the source electrode 111, having a same low electric potential or ground connection.

For this structure, the substrate 101, the first body region 103 and the second body region 104 are of the second doping type, and the drain region 106, the source region 105, and the drift region 102 are of the first doping type. The first gate electrode 114 is connected to high electric potential, the drain electrode 110 is connected to high electric potential, the source electrode 111 is connected to low electric potential or ground, the drain field plate 115 is connected to the drain electrode 110, the shield gate electrode 120 is connected to the source electrode 111, and the voltage differential between the drain and the source is undertaken by a reverse PN junction consisting of the first body region 103 and the drift region 102. The second gate electrode 141 may be connected to the first gate electrode 114 or connected to other bias potential, in which case due to high electric potential of the first gate electrode 114, holes are depleted and an inverse channel appears on a surface of the first body region 103, and the device is in ON state. When the voltage differential sufficient to generate hot carriers is applied between the drain and the source, hot electron-hole pairs are generated at a breakdown point of the device. As a result, motion track changes. Due to presence of the shield gate electrode 120, low electric potential is provided here and the path of hot electrons is far away from the left side of the dielectric trench 107, thus improving effects of electron injection on the left side of the dielectric trench 107. Due to presence of the drain field plate 115, high electric potential which is the same as the drain electrode 110 is provided here and the path of hot holes is far away from the left side of the dielectric trench 107, thus improving injection of hole injection on the right side of the dielectric trench 107. Meanwhile, the presence of the shield gate electrode 120 improves the gate-drain parasitic capacitance $C_{gd}$ of the LDMOS device to a certain extent, and a part of the first gate electrode 114 and the second gate electrode 141 further perform the function of the field plate. High electric potential enables accumulation of electrons on a surface of the drift region 102 close to high electric potential and an electron accumulation layer is generated at an ON state, decreasing the ON-resistance. In addition, the differential of electric potential between the drain and the source makes the PN junction between the first body region 103 and the drift region 102 depleted and the depletion region widens to undertake voltage between the drain and the source. When, in OFF state, the drain field plate 115 is connected to the drain electrode 110 and high electronic potential and the first gate electrode 114 is connected to low electric potential or ground (low electric potential ensures not to open the channel), the channel is not open, the reverse PN junction formed between the second body region 103 and the drift region 102 is depleted to block high voltage and simultaneously the shield gate electrode 120 also helps to deplete the drift region 102 to a certain extent.

Embodiment 7

Figure 10:
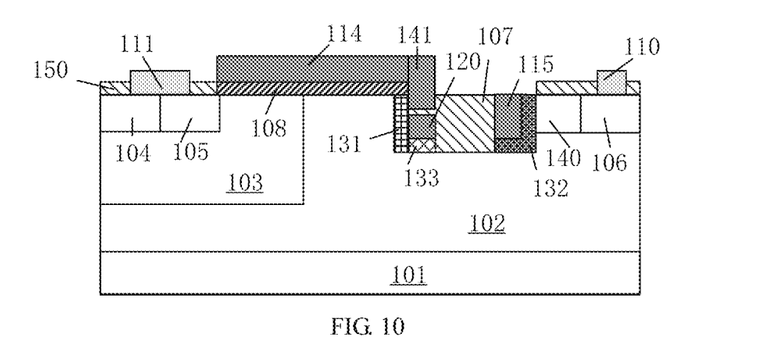
FIG. 10 is an LDMOS structure of improving hot carrier injection provided according to embodiment 7 of the present invention.

A power LDMOS device having a dielectric trench is shown in FIG. 10. On the basis of embodiment 6, a second drift region 140 is provided between the dielectric trench 107 and the drain region 106, wherein the second drift region 140 is of a first doping type and a doping concentration of the region may be consistent with or lower than a doping concentration of the drain region 106, in the embodiment.

For this structure, the drain field plate 115 is connected to the drain electrode 110, the shield gate electrode 120 is connected to the source electrode 111, and the first gate electrode 114 and the second gate electrode 141 may be connected to share a same electric potential or electric potential is provided by different biases. The presence of the second drift region 140 makes the distance between the dielectric trench 107 and the drain region 106 larger. When the voltage differential sufficient to generate hot carriers is applied between the drain and the source, the right side of the dielectric trench 107 and the drain region 106 have the same electric potential due to presence of the drain field plate 115, such that the second drift region 140 does not participate in voltage withstanding of the reverse PN junction formed in the first body region 103 and the drift region 102, and the second drift region 140 provides a wider region for carriers to pass through, i.e. the path of carriers is wider, such that not all carriers go along the right wall of the dielectric trench 107. As a result, collision of holes with the dielectric trench generated when hot holes pass through the right wall of the dielectric trench 107 is relieved to a certain extent, such that holes are farther away from the right side of the dielectric trench 107, resulting in better avoiding effects of hole injection. Meanwhile, the presence of the shield gate electrode 120 performs the function of preventing hot electron injection and lowering gate-drain capacitance. However, the second drift region 140 is introduced. Such design will make area of a cell larger. As for specific application, it is necessary to make a trade-off according to the requirements.

Embodiment 8

Figure 11:
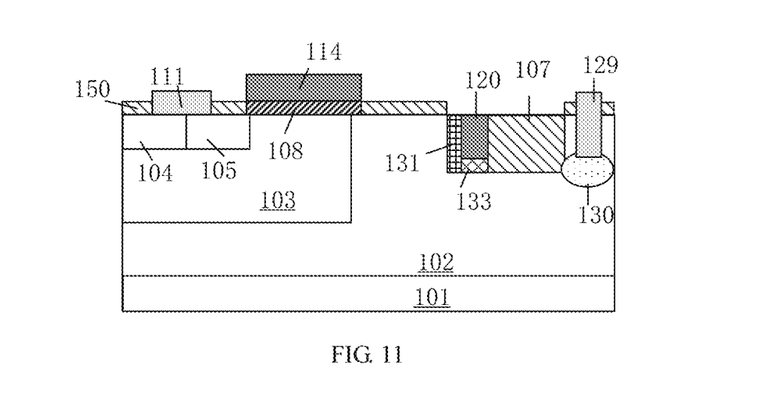
FIG. 11 is an LDMOS structure of improving hot carrier injection provided according to embodiment 8 of the present invention.

As shown in FIG. 11, a power LDMOS device having a dielectric trench, comprises a first doping type substrate 101, a first doping type drift region 102 provided on the substrate 101, and a dielectric trench 107 on a surface of the drift region 102;

wherein the dielectric trench 107 comprises a shield gate electrode 120; the shield gate electrode 120 is positioned at one side of the dielectric trench 107 close to a source electrode, a first oxide layer 131 is provided at one side of the shield gate electrode 120 close to the source electrode, and a third oxide layer 133 is provided at the bottom of the shield gate electrode 120;

the power semiconductor device comprises a first body region 103 on a surface of the drift region 102 in which a second body region 104 and a source region 105 are provided; a gate dielectric 108 covers an upper surface of the first body region 103 and covers a part of upper surfaces of the source region 105 and the drift region 102, a first gate electrode 114 is provided on an upper surface of the gate dielectric 108, a source electrode 111 is provided on upper surfaces of the second body region 104 and the source region 105, the first body region 103 and the second body region 104 are of the second doping type, and the source region 105 and the drain region 106 are of the first doping type;

a drain of the device comprises a deeply-embedded drain electrode 129 and a deep drain region 130 under the deeply-embedded drain electrode 129, the deep drain region 130 contacting a position of the dielectric trench 107 close to a corner of the drain.

For this structure, the method for improving hole injection is not limited to introduction of high electric potential inside the dielectric trench 107 or the drain is deepened into the semiconductor to avoid appearance of the dielectric trench 107 on the ON-path. By etching a deep trench through trench etching on the drain region and performing ionic diffusion through the deep trench, a diffusion region wraps a corner of the dielectric trench 107, forming a deep drain region 130. Subsequently, depositing of the deeply-embedded drain electrode 129 is performed again, to thus obtain contact of the drain. When the source electrode 111 is connected to low electric potential or ground, and the deeply-embedded drain electrode 129 is connected to high electric potential, and the first gate electrode 114 is connected to high electric potential, an inverse channel is formed on a surface of the first body region 103 and the device is in ON state. The shield gate electrode 120 is connected to the source electrode. Under the effect of high electric potential of the deeply-embedded drain electrode 129, hot electrons and hot holes are generated inside the device, and the path of carriers inside the semiconductor does not pass through the right corner of the dielectric trench 107. Besides, there will be no depletion close to the right corner of dielectric trench 107 because of high doping concentration of deep drain region 130 leading to no electric field. With the application of this design, by changing the track of carriers, when breakdown occurs to the device, a hot electron-hole pair generated at the right corner of the dielectric trench 107 is absorbed by the deeply-embedded drain electrode 129, to thereby effectively improve injection of holes on the right side of the dielectric trench 107. In addition, the shield gate electrode 120 on the left side inside the dielectric trench 107 not only is used to decrease gate-drain parasitic capacitance $C_gd$ of the device, but also improves the effects of hot electron injection on the left side of the dielectric trench 107 in OFF state, the differential of voltage between the source and the drain is undertaken by a reverse PN junction consisting of the drift region 102 and the first body region 103 and the presence of the shield gate electrode 120 also helps to deplete the drift region to a certain extent.

What is claimed is:

1. A power semiconductor device for improving a hot carrier injection, comprising a second doping type substrate, a first doping type drift region provided on the second doping type substrate, and a dielectric trench on a surface of the first doping type drift region;
wherein the dielectric trench comprises a drain field plate positioned at a first side of the dielectric trench close to a drain, and a shield gate electrode entirely positioned between a gate and the drain and positioned at a second side of the dielectric trench close to a source electrode, a first gate electrode is positioned at an upper side of a gate dielectric, a first oxide layer is provided at one side of the shield gate electrode close to the source electrode, a third oxide layer is provided at a bottom of the shield gate electrode, and a second oxide layer is provided at one side of the drain field plate close to the drain; the drain field plate in the dielectric trench is connected to a drain electrode, having identical electric potential; and the shield gate electrode in the dielectric trench is connected to the source electrode, having identical low electric potential or ground connection;
the power semiconductor device further comprises a first body region of a second doping type on a surface of the first doping type drift region, a drain region of a first doping type, a second body region of the second doping type and a source region of the first doping type, the second body region and the source region are provided inside the first body region; the gate dielectric covers an upper surface of the first body region and covers a part of upper surfaces of the source region and the first doping type drift region, the first gate electrode is provided on an upper surface of the gate dielectric, the drain electrode is provided on an upper surface of the drain region, and the source electrode is provided on upper surfaces of the second body region and the source region.

2. The power semiconductor device according to claim 1, wherein a JFET region is provided between the dielectric trench and the first body region, the JFET region is of a first doping type, and a doping concentration of the JFET region is higher than a doping concentration of the first doping type drift region.

3. The power semiconductor device according to claim 1, wherein a second gate electrode is provided under the shield gate electrode; and one side of the first body region close to the drain extends to the first oxide layer.

4. A power semiconductor device for improving a hot carrier injection, comprising a first doping type substrate, a first doping type drift region provided on the first doping type substrate, and a dielectric trench on a surface of the first doping type drift region;
wherein the dielectric trench comprises a drain field plate positioned at a first side of the dielectric trench close to a drain and a second gate electrode extending into the dielectric trench and positioned at a second side of the dielectric trench close to a source electrode, a first oxide layer is provided at one side of the second gate electrode close to the source electrode, and a second oxide layer is provided at one side of the drain field plate close to the drain; the drain field plate in the dielectric trench is connected to a drain electrode, having identical electric potential;
the power semiconductor device further comprises a first body region on a surface of the first doping type drift region, wherein a second body region and a source region are provided in the first body region, and a drain region; a gate dielectric covers an upper surface of the first body region and covers a part of upper surfaces of the source region and the first doping type drift region, a first gate electrode is provided on an upper surface of the gate dielectric, a drain electrode is provided on an upper surface of the drain region, and the source electrode is provided on upper surfaces of the second body region and the source region.

5. The power semiconductor device according to claim 4, wherein a third oxide layer is provided at a bottom of the second gate electrode.

6. The power semiconductor according to claim 5, wherein a shield gate electrode is provided between the second gate electrode and the third oxide layer, and the shield gate electrode in the dielectric trench is connected to the source electrode, having identical low electric potential or ground connection.

7. The power semiconductor device according to claim 6, wherein the dielectric trench intersects the drain region or a second drift region is provided between the dielectric trench and the drain region, wherein the second drift region is of a first doping type.

8. A power semiconductor device for improving a hot carrier injection, comprising a first doping type substrate, a first doping type drift region provided on the first doping type substrate, and a dielectric trench on a surface of the first doping type drift region;
wherein the dielectric trench comprises a shield gate electrode; the shield gate electrode is positioned at one side of the dielectric trench close to a source electrode, a first oxide layer is provided at one side of the shield gate electrode close to the source electrode, and a third oxide layer is provided at a bottom of the shield gate electrode;
the power semiconductor device further comprises a first body region on a surface of the first doping type drift region, wherein a second body region and a source region are provided in the first body region; a gate dielectric covers an upper surface of the first body region and covers a part of upper surfaces of the source region and the first doping type drift region, a first gate electrode is provided on an upper surface of the gate dielectric, and the source electrode is provided on upper surfaces of the second body region and the source region; and
a drain of the power semiconductor device comprises a deeply-embedded drain electrode and a deep drain region under the deeply-embedded drain electrode, the deep drain region contacting a position of the dielectric trench close to a corner of the drain.

9. The power semiconductor device according to claim 1, wherein the first doping type is an N-type doping and the second doping type is a P-type doping; or the first doping type is the P-type doping and the second doping type is the N-type doping.

10. The power semiconductor device according to claim 2, wherein the first doping type is an N-type doping and the second doping type is a P-type doping; or the first doping type is the P-type doping and the second doping type is the N-type doping.

11. The power semiconductor device according to claim 3, wherein the first doping type is an N-type doping and the second doping type is a P-type doping; or the first doping type is the P-type doping and the second doping type is the N-type doping.

12. The power semiconductor device according to claim 4, wherein the first doping type is an N-type doping and the second doping type is a P-type doping; or the first doping type is the P-type doping and the second doping type is the N-type doping.

13. The power semiconductor device according to claim 5, wherein the first doping type is an N-type doping and the second doping type is a P-type doping; or the first doping type is the P-type doping and the second doping type is the N-type doping.

14. The power semiconductor device according to claim 6, wherein the first doping type is an N-type doping and the second doping type is a P-type doping; or the first doping type is the P-type doping and the second doping type is the N-type doping.

15. The power semiconductor device according to claim 7, wherein the first doping type is an N-type doping and the second doping type is a P-type doping; or the first doping type is the P-type doping and the second doping type is the N-type doping.

16. The power semiconductor device according to claim 8, wherein the first doping type is an N-type doping and the second doping type is a P-type doping; or the first doping type is the P-type doping and the second doping type is the N-type doping.

* * * * *